(12) United States Patent
Kanno et al.

(10) Patent No.: US 8,084,830 B2
(45) Date of Patent: Dec. 27, 2011

(54) NONVOLATILE SEMICONDUCTOR MEMORY DEVICE

(75) Inventors: Hiroshi Kanno, Kawasaki (JP); Kenichi Murooka, Yokohama (JP); Jun Hirota, Yokohama (JP); Hideyuki Tabata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/556,005

(22) Filed: Sep. 9, 2009

(65) Prior Publication Data

US 2010/0213550 A1 Aug. 26, 2010

(30) Foreign Application Priority Data

Feb. 24, 2009 (JP) ................................. 2009-040475

(51) Int. Cl.
*H01L 27/11* (2006.01)
(52) U.S. Cl. ........ 257/379; 257/296; 257/298; 257/350; 257/359; 257/530
(58) Field of Classification Search ........................ None
See application file for complete search history.

(56) References Cited

U.S. PATENT DOCUMENTS

2006/0177947 A1* 8/2006 Yoshida et al. .................. 438/3

FOREIGN PATENT DOCUMENTS

| JP | 2001-237434 A | 8/2001 |
|---|---|---|
| JP | 2007-53171 A | 3/2007 |
| JP | 2007-250720 A | 9/2007 |
| JP | 2008-310856 A | 12/2008 |
| JP | 2010-522990 W | 7/2010 |
| KR | 10-2006-0042734 | 5/2006 |
| KR | 10-2007-0062435 | 6/2007 |
| WO | WO 2010/026653 A1 | 3/2010 |
| WO | WO 2010/026654 A1 | 3/2010 |
| WO | WO 2010/026655 A1 | 3/2010 |
| WO | WO 2010/041302 A1 | 4/2010 |

OTHER PUBLICATIONS

S. Brad Herner, et al., "Polysilicon Memory Switching: Electrothermal—Induced Order", IEEE Transaction on Electron Devices, vol. 53, No. 9, Sep. 2006, pp. 2320-2327.
Emil V. Jelenkovic, et al., "SiGe-Si junctions with boron-doped SiGe films deposited by co-sputtering", Solid—State Electronics, vol. 50, 2006, pp. 199-204.
R.L. Jiang, et al., "Properties of Schottky contact of Al on SiGe alloys", Appl. Phys. Lett., vol. 68, No. 8, Feb. 19, 1996, pp. 1123-1125.
U.S. Appl. No. 12/823,611, filed Jun. 25, 2010, Iwakaji et al.
U.S. Appl. No. 12/844,374, filed Jul. 27, 2010, Iwakaji et al.
U.S. Appl. No. 12/872,284, filed Aug. 31, 2010, Hirota et al.
U.S. Appl. No. 12/873,604, filed Sep. 1, 2010, Iwakaji et al.
Office Action issued May 20, 2011, in Korean Application No. 10-2010-16080, filed Feb. 23, 2010 with an English Translation.
Japanese Office Action dated Aug. 2, 2011 for Patent Application No. 2009-040475 (with English translation).

* cited by examiner

*Primary Examiner* — N Drew Richards
*Assistant Examiner* — Kyoung Lee
(74) *Attorney, Agent, or Firm* — Oblon, Spivak, McClelland, Maier & Neustadt, L.L.P.

(57) ABSTRACT

The memory cell is located at respective intersections between the first wirings and the second wirings. Each of the memory cells has a rectifier element and a variable resistance element connected in series. The rectifier element includes a p type first semiconductor region, and a n type second semiconductor region. The first semiconductor region is formed of, at least in part, silicon-germanium mixture ($Si_{1-x}Ge_x$ ($0<x<=1$)). The second semiconductor region is formed of silicon (Si).

15 Claims, 11 Drawing Sheets

NONVOLATILE SEMICONDUCTOR MEMORY DEVICE

CROSS-REFERENCE TO RELATED APPLICATION

This application is based on and claims the benefit of priority from prior Japanese Patent Application No. 2009-40475, filed on Feb. 24, 2009, the entire contents of which are incorporated herein by reference.

BACKGROUND OF THE INVENTION

1. Field of the Invention

The present invention relates to a nonvolatile semiconductor memory device, more specifically to a nonvolatile semiconductor memory device including memory cells arranged therein, each of the memory cells including a diode and a variable resistor connected in series.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistive memory is attracting attention as a candidate to succeed these kinds of semiconductor memory devices utilizing a MOSFET as a memory cell (refer, for example, to Japanese Unexamined Patent Application Publication (Translation of PCT Application) No. 2005-522045). The resistive memory devices herein include resistive RAM (ReRAM), in a narrow sense, that uses a transition metal oxide as a recording layer and stores its resistance states in a non-volatile manner, as well as Phase Change RAM (PCRAM) that uses chalcogenide or the like as a recording layer to utilize the resistance information of crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner.

In a unipolar type ReRAM, data write to the memory cell is performed by applying a certain voltage to the variable resistance element for a short time. This allows the variable resistance memory cell to change from a high resistance state to a low resistance state. Such the operation for changing the variable resistance element from a high resistance state to a low resistance state is called "a setting operation".

On the other hand, data erase of the memory cell is performed by applying a certain voltage that is smaller than that in the setting operation, to the variable resistance element having a low resistance state after the setting operation, for a longer time. This allows the variable resistance memory cell to change from a low resistance state to a high resistance state. Such the operation for changing the variable resistance element from a low resistance state to a high resistance state is called "a reset operation". The memory cell is in a stable state in the high resistance state (the reset state), for example. If the memory cell stores 2-value data, data write thereto is performed by a setting operation that changes the reset state to a low resistance state.

During a reset operation, a large current of 1 μA or more serving as a resetting current must be passed through the memory cells. However in this case, there is a problem that a voltage occurring between memory cells after completion of the reset operation reaches a value extremely close to the setting voltage required in the previously mentioned setting operation, and an operating margin is small. The operating margin being small means it may occur that, after completion of the reset operation, the memory cells once more mistakenly undergo the setting operation, which is undesirable.

Moreover, in conventional resistive memory, there is a problem that a reverse leak current flowing in the transistor during write is not sufficiently reduced, and power consumption is large.

SUMMARY OF THE INVENTION

In accordance with an aspect of the present invention, a semiconductor memory device is provided. The semiconductor memory device comprises: a plurality of first wirings and a plurality of second wirings formed to intersect with each other; and a memory cell array including memory cells arranged therein. Each of the memory cells is located at respective intersections between the first wirings and the second wirings. Each of the memory cells having a rectifier element and a variable resistance element connected in series. The rectifier element includes: a p type first semiconductor region; a n type second semiconductor region; and a third semiconductor region formed to be sandwiched between the first and second semiconductor regions, and having an impurity concentration that is smaller than those of the first and second semiconductor regions. The first to third semiconductor regions are laminated in the rectifier element. The first semiconductor region is formed of, at least in part, silicon-germanium mixture ($Si_{1-x}Ge_x$ ($0<x<=1$)). The second and third semiconductor regions are formed of silicon (Si).

DETAILED DESCRIPTION OF THE EMBODIMENTS

The embodiments of the invention will now be described in detail with reference to the drawings.

[Entire Configuration]

Figure 1:
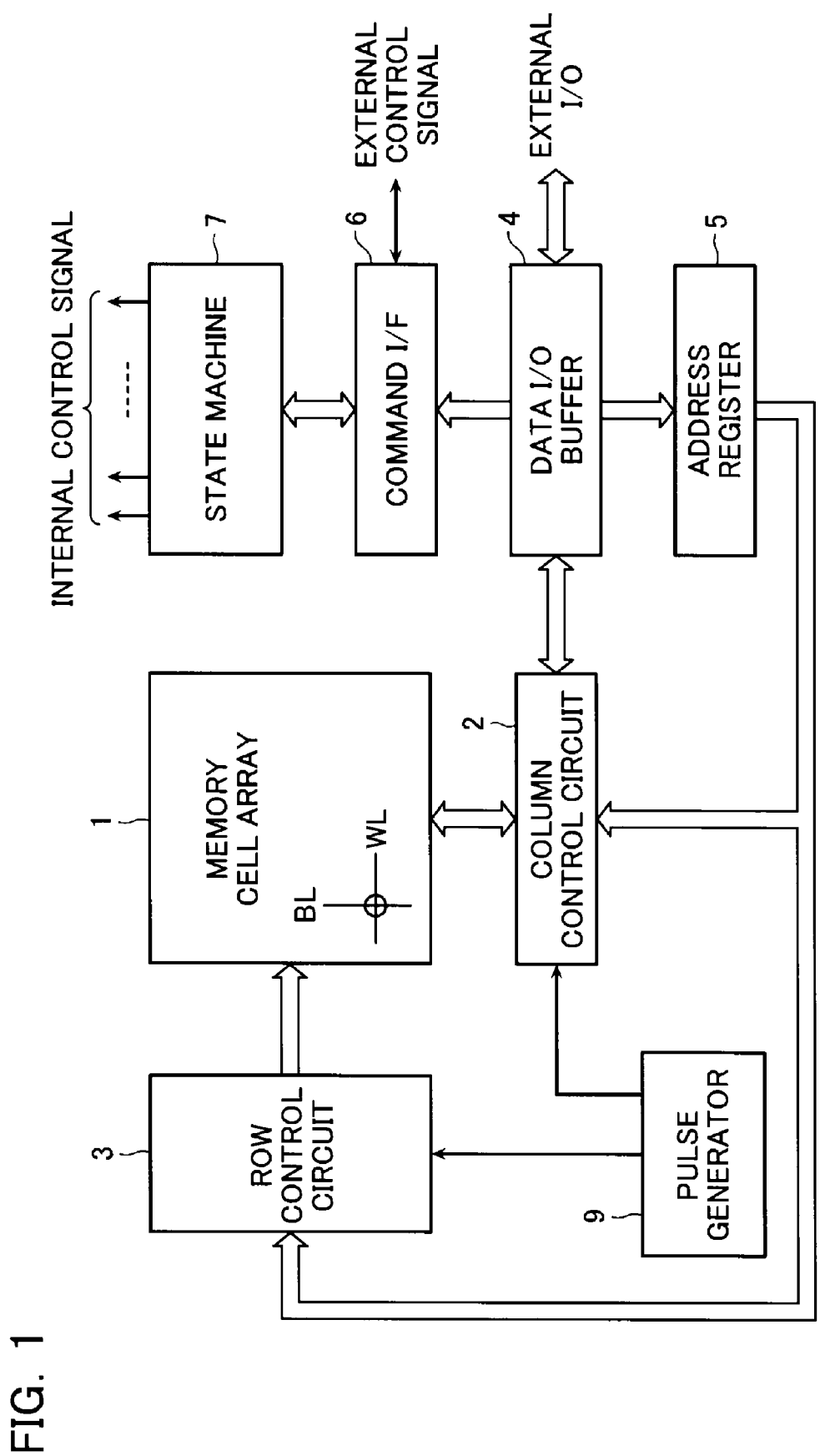
FIG. 1 is a block diagram of a nonvolatile semiconductor memory device in accordance with an embodiment of the present invention.

FIG. 1 is a block diagram of a nonvolatile memory in accordance with the embodiment of the present invention.

The non-volatile memory includes a memory cell array 1 including a memory cells with ReRAM (variable resistive elements) described later arranged therein in a matrix form.

A column control circuit 2 is provided at a position adjacent to the memory cell array 1 in the bit line BL direction. It controls the bit line BL in the memory cell array 1 to erase data from the memory cell, write data in the memory cell, and read data out of the memory cell.

A row control circuit 3 is provided at a position adjacent to the memory cell array 1 in the word line WL direction. It selects the word line WL in the memory cell array 1 and applies voltages required to erase data from the memory cell, write data in the memory cell, and read data out of the memory cell.

The data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external.

An address fed from external to the data I/O buffer 4 is sent via the address register 5 to the column control circuit 2 and the row control circuit 3.

A command fed from the host to the data I/O buffer 4 is sent to the command interface 6. The command interface 6 receives an external control signal from the host and decides whether the data fed to the data I/O buffer 4 is write data, a command or an address. If it is a command, then the command interface 6 transfers it as a received command signal to the state machine 7.

The state machine 7 manages the entire nonvolatile memory to receive commands from the host to execute read, write, erase, and execute data I/O management. The external host can also receive status information managed by the state machine 7 and decides the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3. Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuit]

Figure 2:
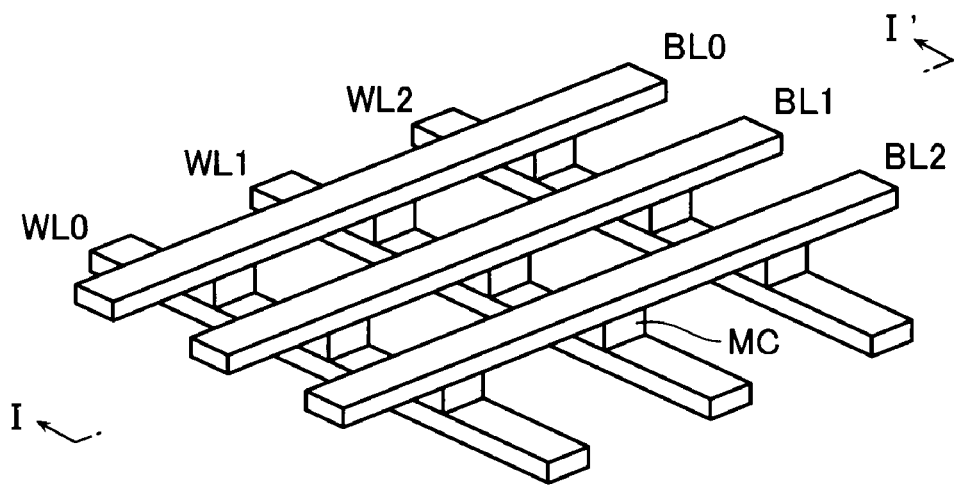
FIG. 2 is a perspective view of a part of the memory cell array 1.
Figure 3:
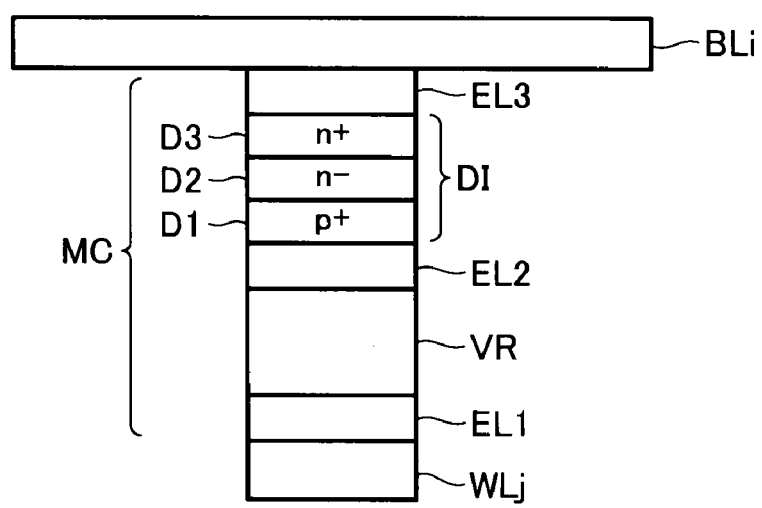
FIG. 3 is a cross-sectional view of one memory cell taken along the line I-I' and seen from the direction of the arrow in FIG. 2.

FIG. 2 is a perspective view of a part of the memory cell array 1. FIG. 3 is a cross-sectional view of one memory cell taken along the line I-I' and seen from the direction of the arrow in FIG. 2.

Word lines WL (WL0~WL2) as first wiring layers 10 are arranged in parallel, and bit lines BL (BL0~BL2) as second wiring layers 30 are arranged in parallel and intersecting with the word lines. Memory cells MC are arranged to be sandwiched by the word lines and the bit lines at intersections therebetween. The first and second wiring layers are preferably made from a material with good heat resistance and a low resistance, for example, tungsten (W), tungsten silicide (WSi), nickel silicide (NiSi), cobalt silicide (CoSi), or the like.

[Memory Cell MC]

The Memory cell MC comprises a series-connected circuit including a variable resistor VR and a diode DI as shown in FIG. 3. The variable resistor VR is formed of material that can change its resistance value through an electric current, heat, chemical energy caused by an application of a voltage.

Also, electrodes EL1 and EL2 are located above and below the variable resistor VR. These electrodes EL1 and EL2 function as a barrier metal and an adhesive layer. As material of the electrode EL1 and EL3, Pt, Au, Ag, TiAlN, SrRuO, Ru, RuN, Ir, Co, Ti, TiN, TaN, LaNiO, Al, PtIrOx, PtRhOx, Rh/TaAlN, W may be used. Moreover, as material of the electrode EL2, W, WN, TaN, TaSiN, $TaSi_2$, TiC, TaC, $Nb-TiO_2$ may be used in consideration of a work function thereof. It is also possible that material of the electrode EL1 and EL3 may be the same as that of the electrode EL2. Moreover, it is also possible that a metal film that may equalize orientation characteristics of the materials. Moreover, a buffer layer, a barrier metal layer, an adhesive layer or the like may be additionally inserted.

[Resistance Change Element VR]

The resistance change element VR may include one that comprises a composite compound containing cations of a transition element and varies the resistance through migration of cations (ReRAM).

Figure 4:
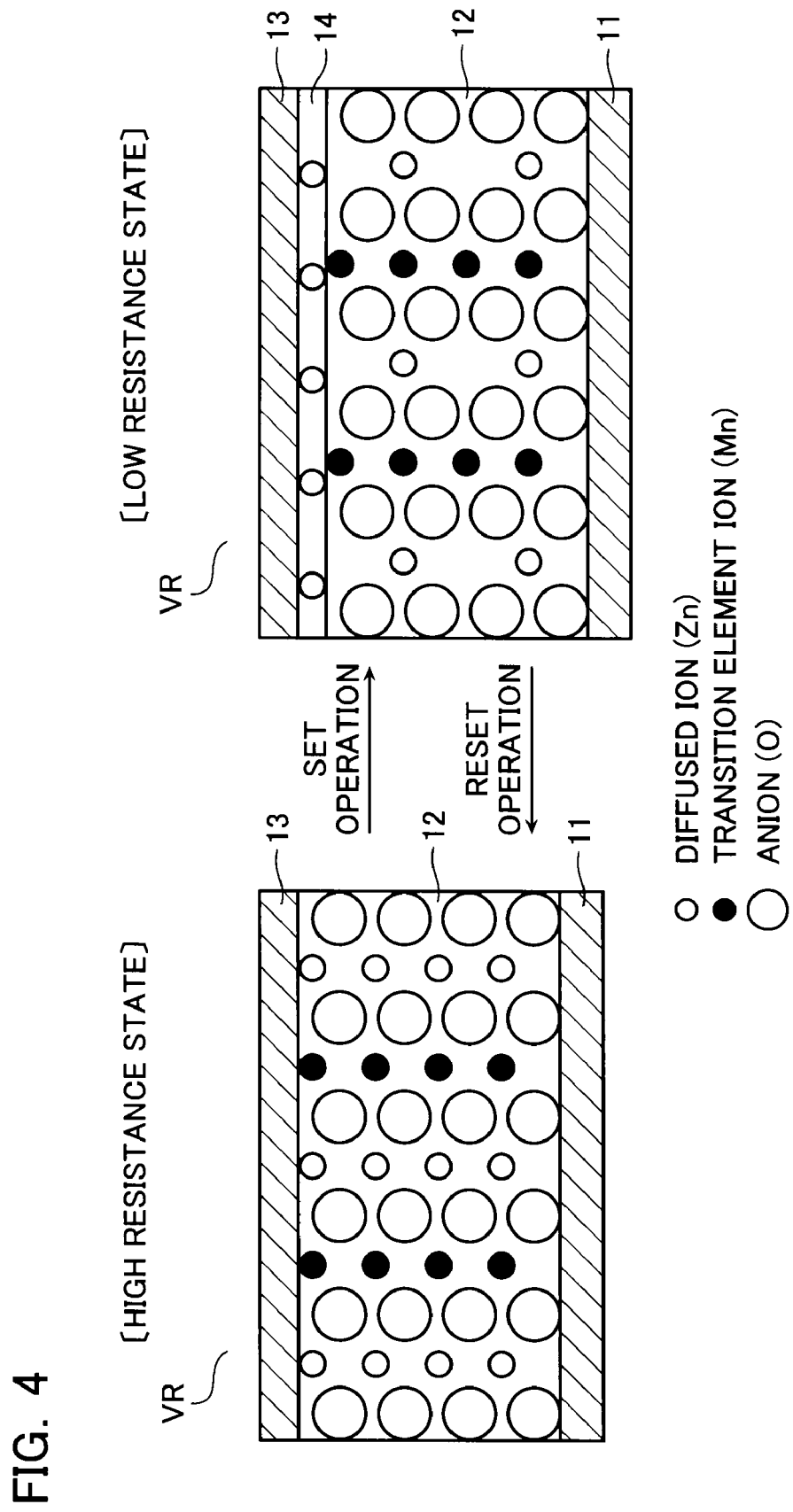
FIG. 4 is a view showing an example of a variable resistor VR.
Figure 5:
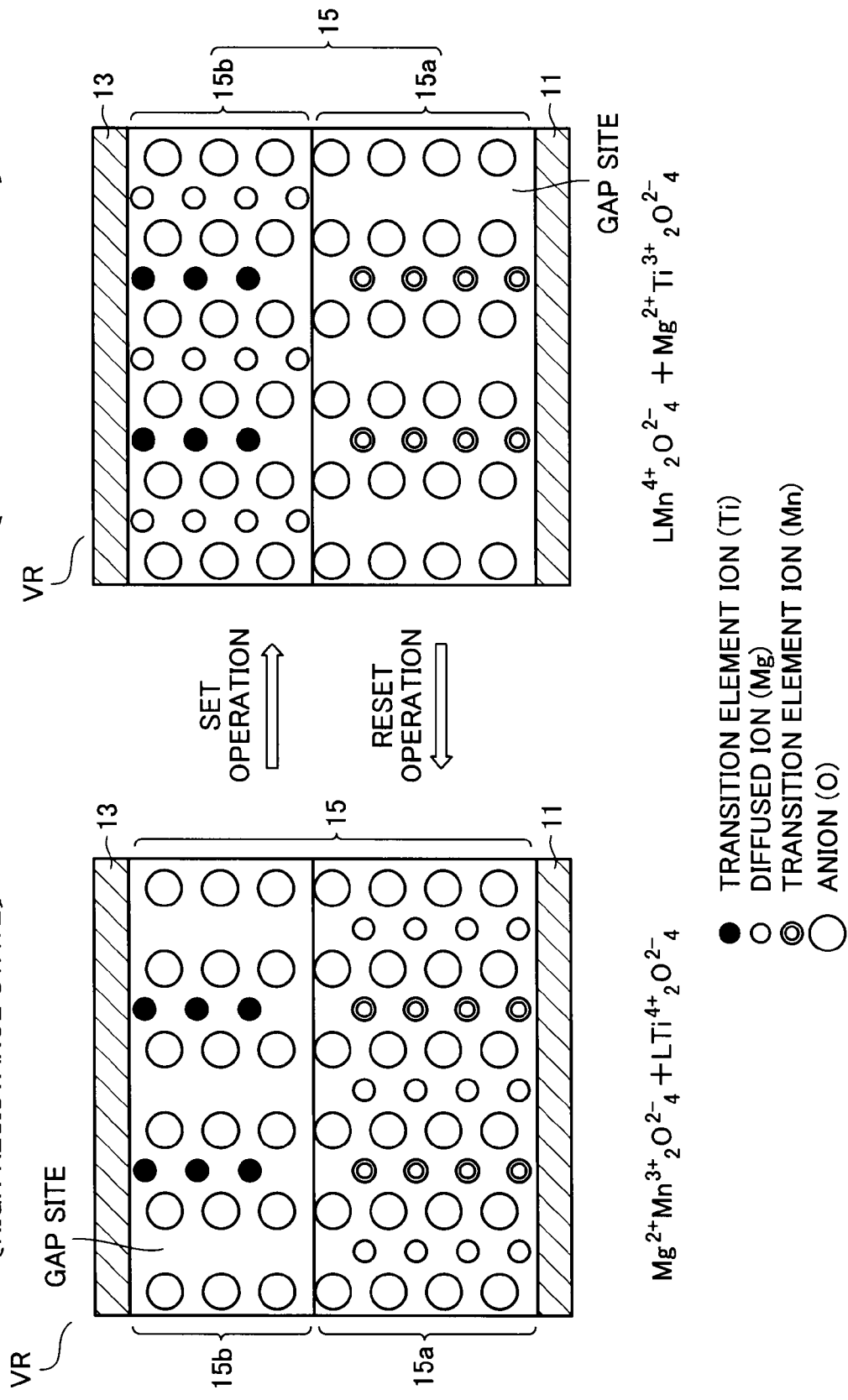
FIG. 5 is a view showing an example of a variable resistor VR.

FIGS. 4 and 5 are views showing examples of the resistance change element VR. The resistance change element VR shown in FIG. 4 includes a recording layer 12 arranged between the electrode layers 11 and 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, $ZnMn_2O_4$ is used, A comprising Zn, M comprising Mn, and X comprising O. The variable resistor VR may also be configured by a thin film made from one of materials such as NiO, $TiO_2$, $SrZrO_3$, and $Pr_{0.7}Ca_{0.3}MnO_3$.

In FIG. 4, a small white circle in the recording layer 12 represents a diffused ion (Zn), a large white circle represents an anion (O), and a small black circle represents a transition element ion (Mn). An initial state of the recording layer 12 is a high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On data reading, a current may be allowed to flow, of which value is very small so that the material configuring the recording layer 12 causes no resistance variation. A programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

Figure 6:
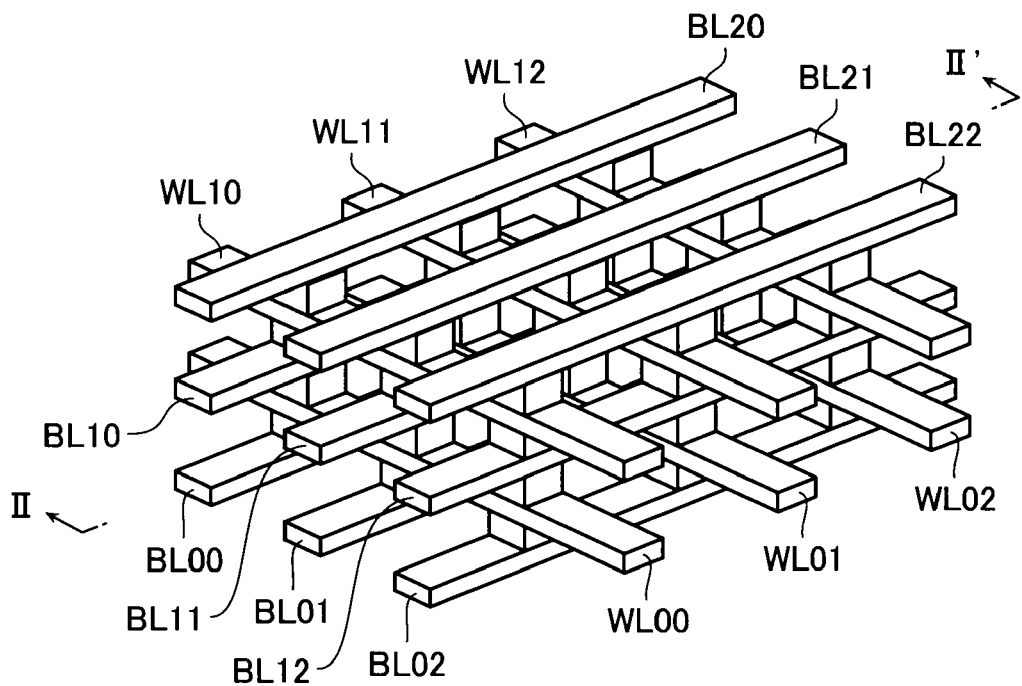
FIG. 6 illustrates another example of the structure of the memory cell array.

In the example in FIG. 6, a recording layer 15 sandwiched by the electrode layer 11 and 13 is configured by two layers: a first compound layer 15a and a second compound layer 15b. The first compound layer 15a is arranged on a side close to the electrode layer 11 and represented by a chemical formula $A_xM1_yX1_z$. The second compound layer 15b is arranged on a side close to the electrode layer 13 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

Potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such a case, migration of part of diffused ions in the first compound layer 15a therefrom into the second compound layer 15b generates conduction carriers in the crystals of the first and second compounds, and thus both have electric conduction. The programmed state (low-resistance state) may be reset to an erased state (high-resistance state) by supplying a large current flow in the recording layer 15 for a sufficient time for Joule heating to facilitate the oxidation reduction reaction in the recording layer 15, as in the preceding example. Application of an electric field in the opposite direction from that at the time of setting may also allow reset.

As shown in FIG. 3, The diode DI is a PIN diode that includes a p+ type layer D1, an n− type layer D2, and an n+ type layer D3. Note that the "+" and "−" symbols indicate a level of an impurity concentration.

[Modified Example of Memory Cell Array]

Figure 7:
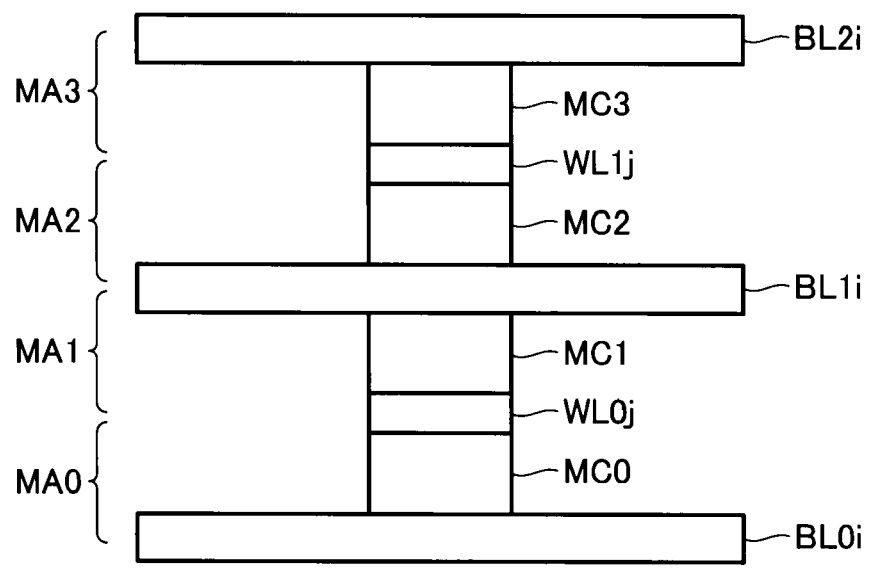
FIG. 7 illustrates another example of the structure of the memory cell array.

Plural such memory structures described above may be stacked to form a three-dimensional structure as shown in FIG. 6. FIG. 7 is a cross-sectional view showing an II-II' section in FIG. 6. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3.

In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 8:
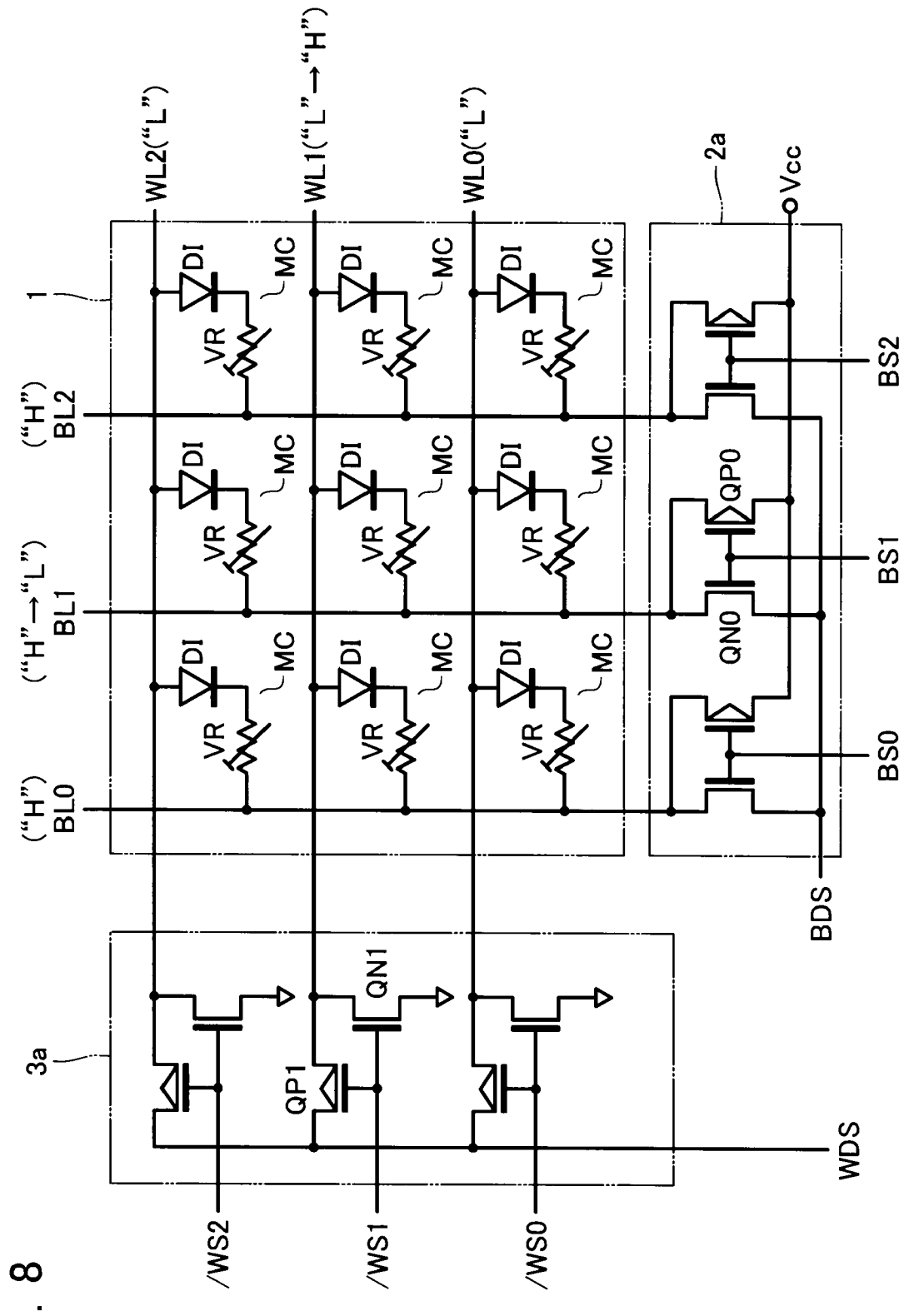
FIG. 8 illustrates a circuit diagram of the memory cell array 1 and the peripheral circuit.

FIG. 8 is a circuit diagram of the memory cell array 1 and peripheral circuits thereof. For simplicity, the description advances on the assumption that the memory has a single-layered structure.

In FIG. 8, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit 2a. Alternatively, the memory cell array 1 may be configured so that the polarity of the diode Di is reversed with respect to the circuit shown in FIG. 7, and a current flows from the bit line BL to the word line WL.

[Diode DI]

Figure 9:
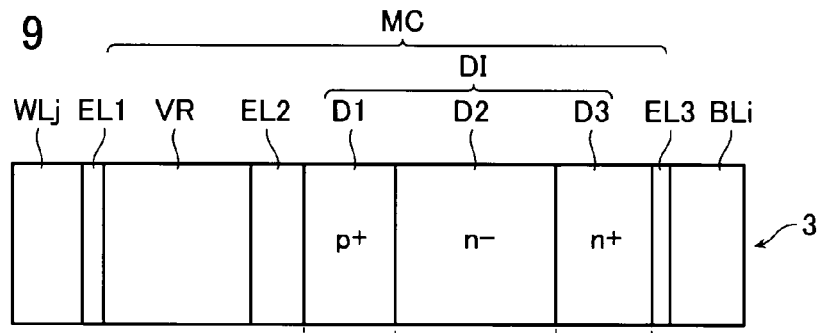
FIG. 9 explains a structure of the diode Di in the memory cell MC.

Referring now to FIG. 9, a structure of the diode DI of the memory cell MC is explained in further detail. FIG. 9 illustrates a state of the energy band of the diode D1 of the memory cell MC according to the first embodiment, together with a sectional view of the memory cell MC.

The memory cell MC comprises a variable resistor element VR and a diode DI connected in series, as well as the above-described metal electrode El1-EL3.

The diode DI is a PIN diode comprising a p+ type layer D1, an n− type layer D2, and an n+ type layer D3. In the following description, a PIN diode with p+/n−/n+ structure is explained as an example. It may be a PIN diode with p+/p−/n+ structure. In this embodiment, the p+ type layer D1 is formed of silicon-germanium mixture $Si_{1-x}Ge_x$ ($0<x<=1$), while the n-type layer D2 and the n+ type layer D3 are formed of silicon (Si). Therefore, energy levels of these layers D1-D3 included in the diode DI are represented as shown in FIG. 9. With such a structure, a resistance of an interface of a p+ side electrode may be lowered, without deteriorating a leak in the opposite direction, thereby steepening a curve of a forward-direction current-voltage characteristic. Moreover, since Schottky barrier between the p+ type layer D1 and the metal electrode EL2 is lowered, a forward-direction voltage Vf of the diode D1 when it is in a conductive state also may be lowered.

Note that boron (B) is suitable for impurity for $Si_{1-x}Ge_x$ ($0<x<=1$) to be injected in the p+ type layer D1 from a viewpoint of reducing a lattice distortion and suppressing a lattice imperfection.

In a semiconductor-metal junction interface, Schottky barrier may be created due to the difference of work functions thereof. In the diode DI, the Schottly barrier is created at an interface between the p+ type layer D1 and the electrode EL2, and at an interface between the n+ type layer D3 and the electrode EL3. In this embodiment, a material of the p+ type layer D1 is $Si_{1-x}Ge_x$ ($0<x<=1$). Accordingly, a height of Schottky barrier formed at the interface may be low. Also, a parasitic resistance of the diode DI is suppressed, and an operation margin of the diode DI can be large.

On the other hand, for a material of the n− type layer D2, silicon (Si) is preferable, not $Si_{1-x}Ge_x$ ($0<x<=1$). This is because using $Si_{1-x}Ge_x$ ($0<x<=1$) for the layer D2 may increase a reverse leak current. Note that the thickness of the p+ type layer D1 may be around several nanometers.

The conditions that a Schottky barrier against holes is created in the interface between the p+ type layer D1 and the metal electrode EL2 is that a work function qΦs of $Si_{1-x}Ge_x$ included in the p+ type layer D1 is larger than a work function qΦm of the metal electrode EL2. The height of the barrier qΦB is expressed by a difference between these two work functions, i.e., by the following formula. Here, "q" represents elementary electric charge.

$$qΦB = qΦs - qΦm \qquad \text{[Expression 1]}$$

When an impurity concentration of the p+ type layer D1 is extremely high, and a Fermi level of the p+ type layer D1 is positioned at an upper end of the valence band, qΦs is about 5.2 eV. Thus, a Schottky barrier against holes is formed when a work function of the metal electrode EL2 is 5.2 eV or less.

As an example, when the metal electrode EL1 is formed of titanium nitride (TiN), and the p+ type layer D1 is formed of silicon (Si), qΦB has a positive value, because a work function of titanium nitride (TiN) is 4.5-4.7 eV, thereby Schottky barrier being formed against holes. In addition, metal listed below has a work function of 5.2 eV or less, and may be used as a material of the metal electrode EL2. Note that the number in the respective parenthesis denotes a work function of the material.

W (4.6 eV)
WN (4.2-5.0 eV)
TaN (4.5-4.7 eV)
TaSiN (4.2 eV)
TaSi$_2$ (4.0 V)
TiC (5.2 eV or less)
TaC (5.2 eV or less)
Nb—TiO$_2$ (5.2 eV or less)

If a Fermi level of the p+ type layer D1 is at a higher position than an upper end of the valence band by qVp, the work function qΦs of the p+ type layer D1 is Eg1+qχ1−qVp. Here, Eg1 denotes a forbidden band width (a band-gap width) of the p+ type layer D1, and χ1 represent electron affinity of the p+ type layer D1.

The forbidden band width $Eg_1$ of $Si_{1-x}Ge_x$ ($0<x<=1$) is smaller than the forbidden band width Eg2 of silicon (Si). Also, the forbidden bandwidth $Eg_1$ of $Si_{1-x}Ge_x$ ($0<x<=1$) decreases as x (the ratio of the germanium Ge in $Si_{1-x}Ge_x$) increases.

On the other hand, the electron affinity of $Si_{1-x}Ge_x$ ($0<x<=1$) is substantially the same as that of silicon (Si).

Here, comparison is made between when the p+ type layer D1 is formed of $Si_{1-x}Ge_x$ ($0<x<=1$) and when the p+ type layer D1 is formed of silicon (Si) having the same Fermi level. The comparison shows that $Si_{1-x}Ge_x$ ($0<x<=1$) may provide a smaller work function qΦs than that of silicon. Thus, when $Si_{1-x}Ge_x$ ($0<x<=1$) is used for a material of the p+ type layer D1, the height of Schottky barrier against holes between p+ type layer D1 and the metal electrode EL2 may be reduced than when silicon (Si) is used therefor. This may serves to decrease a resistance of the interface between the p+ type layer D1 and the metal electrode EL2. In addition, a parasitic resistance of the diode D1 also decreases. Accordingly, a current-voltage characteristic of the diode D1 may have a steep gradient in an area where the forward-direction current thereof is large.

Moreover, the energy level of the lower end of the conduction band in $Si_{1-x}Ge_x$ ($0<x<=1$) is substantially the same as that of silicon (Si). Also, the energy level of the upper end of the valence band in $Si_{1-x}Ge_x$ ($0<x<=1$) is higher than that of silicon (Si). The energy level of the upper end of the valence band rises with increase of x. Accordingly, the energy level of the upper end of the valence band is discontinuous in the interface between the p+ type layer D1 and the n− type layer D2 (refer to a reference numeral S in FIG. 9).

In a small diode having a size of several nanometers, reverse-direction leak current is mostly composed of interband tunnel current flowing through a depletion layer between the pn junction. The probabilities of the interband tunnel current increases as the forbidden band width in a region where a depletion layer is formed becomes smaller. However, in the diode according to this embodiment, the n− type layer D2 having a smaller impurity concentration wholly turns to a depletion layer. Moreover, the n− type layer D2 is formed of silicon (Si). Therefore the probability of occurrence of an interband tunnel current is not so different compared to when the diode DI is wholly formed of silicon (Si). Thus, according to the structure of this embodiment, a reverse-direction leak current does not deteriorate in comparison with the conventional structure.

Figure 10:
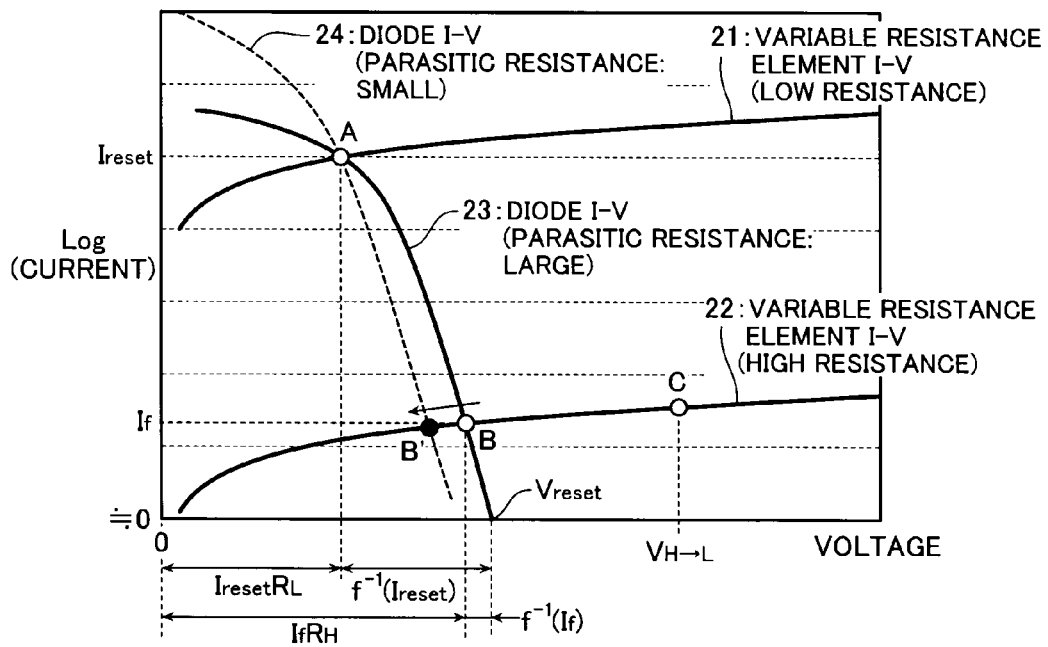
FIG. 10 shows a graph for explaining an operation of the diode 10.

Next, an operation of the diode DI thus configured is described with reference to FIG. 10. In FIG. 10, a horizontal axis shows a voltage applied between the terminals of the diode DI and a vertical axis shows a current flowing through the memory cell MC. Since the vertical axis is a logarithmic display, a point where the current=0 cannot be defined; however, for convenience of explanation herein, a bottom extremity of the vertical axis is taken as the point where the current=0.

FIG. 10 shows current-voltage characteristics 21~24. The current-voltage characteristic 21 is a current-voltage characteristic of the variable resistor VR in the low-resistance state. The current-voltage characteristic 22 is a current-voltage characteristic of the variable resistor VR in the high-resistance state. The current-voltage characteristic 23 is a current-voltage characteristic of the diode DI when a parasitic resistance thereof is large. The current-voltage characteristic 24 is a current-voltage characteristic of the diode DI when a parasitic resistance thereof is small. In addition, FIG. 10 shows a current $I_{reset}$. The current $I_{reset}$ is a current flowing in the memory cell MC when the variable resistor VR is switched (reset) from the low-resistance state to the high-resistance state. Note that, in FIG. 10, the current-voltage characteristics 23 and 24 of the diode DI have a direction of the voltage (horizontal axis) inverted and are plotted to intersect with a point A where the current $I_{reset}$ flows. This is to facilitate distinguishing between a voltage applied to the variable resistor VR and a voltage applied to the diode DI.

Additionally, a resistance of the variable resistor VR in the low-resistance state is set to $R_L$ and a resistance of the variable resistor VR in the high-resistance state is set to $R_H$. Here, the current-voltage characteristic of the diode DI is defined by a function f, and its inverse function is defined by an inverse function $f^{-1}$. Thus, the relation between the current and the voltage of the diode DI is expressed as I=f(V), and V=$f^{-1}$(I). Now, if a voltage applied to the memory cell MC during a reset operation thereof is defined as $V_{reset}$, the following equation is established for a state immediately prior to resetting (point A).

$$I_{reset}R_L + f^{-1}(I_{reset}) = V_{reset} \quad \text{[Expression 2]}$$

A first entry on a left-hand side of the above-described (Expression 2) shows a voltage applied to the variable resistor VR when the current $I_{reset}$ flows in the memory cell MC, and a second entry on the left-hand side of the above-described (Expression 2) shows a voltage applied to the diode DI.

Meanwhile, when a parasitic resistance of the diode DI is large, a current flowing in the memory cell MC immediately after resetting moves along the current-voltage characteristic 23 of the diode DI from the point A to a point B. If a current flowing at this time is defined as $I_f$, since a voltage applied thereto does not change, a relation in (expression 3) shown below is established.

$$I_f R_H + f^{-1}(I_f) = V_{reset} \quad \text{[Expression 3]}$$

Consequently, a voltage $I_f R_H$ applied to the variable resistor VR immediately after resetting can be expressed by (expression 4) shown below.

$$I_f R_H = I_{reset} R_L + f^{-1}(I_{reset}) - f^{-1}(I_f) \quad \text{[Expression 4]}$$

Here, it is assumed that the voltage $I_f R_H$ is larger than a voltage $V_{H \rightarrow L}$ (point C). The voltage $V_{H \rightarrow L}$ (point C) is a voltage when the variable resistor VR switches from the high-resistance state to the low-resistance state. In this case, the variable resistor VR returns again (is set anew) to the low-resistance state in spite of the fact that a reset operation has been executed, and a desired operation on the memory cell MC is not executed.

As is clear from the above-described (expression 3), to avoid the above-described re-setting and obtain a sufficient operation margin, "$f^{-1}(I_{reset}) - f^{-1}(I_f)$" need only be made smaller, that is to say, a gradient of "$f^{-1}$" need only be made more gentle. As mentioned above, "$f^{-1}$" is the inverse function of the current-voltage characteristic f of the diode DI. Accordingly, it can be rephrased that a requirement for obtaining a sufficient operation margin is to steepen the current-voltage characteristic of the diode DI until "$I_{reset}$" is reached. In other words, if the current-voltage characteristic of the diode DI in FIG. 9 is changed from a state "23" to a state "24", the operation point immediately after resetting is shifted from the point B to a point B', thereby the operation margin can be secured.

The parasitic resistance of the diode DI includes a resistance of a semiconductor material itself included in the diode DI, and a resistance caused by a Schottky barrier between the diode D1 and the electrode. Regarding the former, reducing the film thickness of the diode DI along the current direction (especially, the film thickness of the n− type layer D2) is effective for reducing the resistance. Reducing the film thickness of the n− type layer D2, however, leads to increase in the reverse-direction leak current. Increase in the reverse-direction leak current leaves some problems in view of preventing an erroneous reset in the non-selected memory cell during the set operation, and in view of electric consumption.

On the other hand, regarding the latter, i.e., a resistance caused by a Schottly barrier in the interface of the electrode, may be lowered by reducing a height of Schottly barrier, and thinning the Schottly barrier. The thickness of the Schottly barrier may be reduced by increasing the impurity concentration of the p+ type layer D1 and the n+ type layer D3. The height of the Schottly barrier is determined by the difference between a work function of a material of the metal electrode that is in contact with the p+ type layer D1 and the n+ type layer D3, and a work function of material of the p+ type layer D1 and the n+ type layer D3. However, as described above, the electrode EL2 and EL3 also have a function of a barrier metal. In addition, there is a restriction in manufacturing processes. Accordingly, one cannot simply choose a material that has as a small work function as possible.

Figure 11:
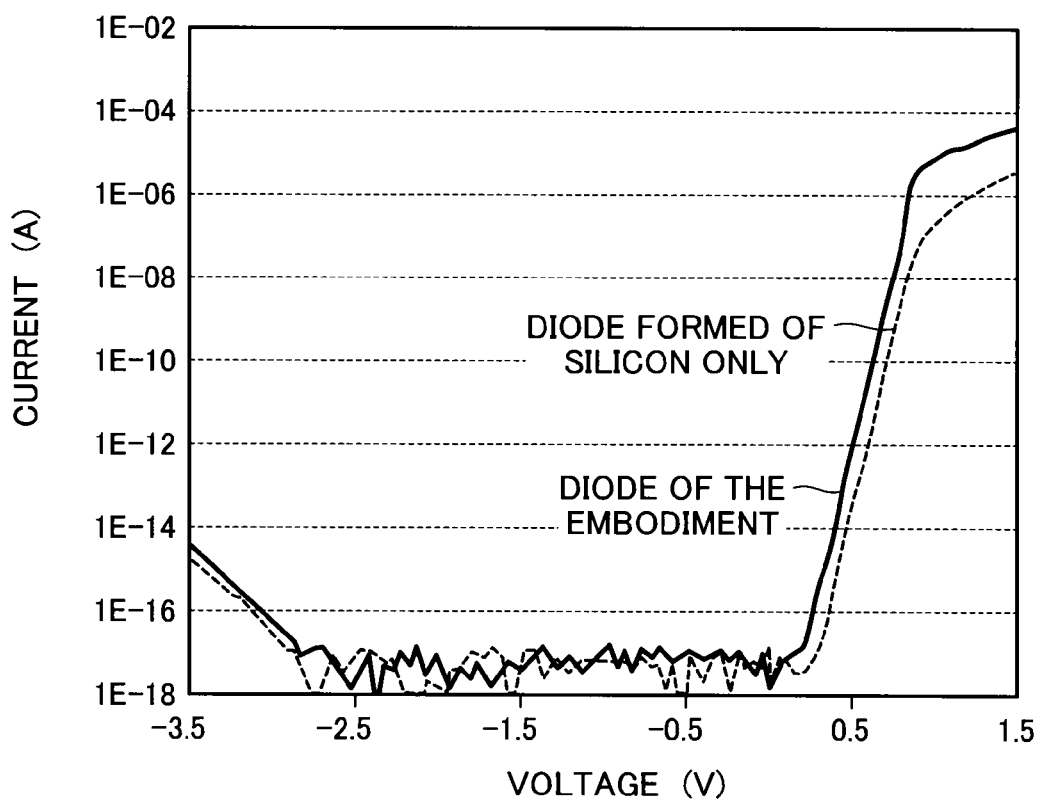
FIG. 11 shows a graph for illustrating an advantage of the embodiment of the present invention.

The inventor calculated a current-voltage characteristic of the diode DI of this embodiment using a device simulator. The calculation result is shown in FIG. 11. It is supposed that the diode DI has an area of 22 nm*22 nm in cross section. Moreover, $Si_{0.85}Ge_{0.15}$ is used as the p+ type layer D1, and has a thickness of 25 nm, and an impurity concentration of $1 \times 10^{20}$ $cm^{-3}$. In addition, the n− type layer D2 is formed of silicon (Si). The thickness of the silicon is 50 nm. Impurity concentration thereof is set to $1 \times 10^{17}$ cm$^{-3}$. In addition, the n+ type layer D3 is formed of silicon (Si), has a thickness of 25 nm, and an impurity concentration of $1*10^{20}$ cm$^{-3}$. The work function of the electrode EL2 is set to 4.7 eV, i.e., a condition that a Schottky barrier against holes is formed in the interface between the p+ type layer D1 and the electrode EL2. On the other hand, the interface between the electrode EL3 and the n+ type layer D3 is supposed to have an ohmic junction. The simulation is conducted under the above-described condition.

It is understood from FIG. 11 that the structure of the diode DI according to this embodiment provides a steeper current-voltage characteristic (i.e., a gradient thereof is large) when the current reaches 1 uA ($1 \times 10^{-6}$ A) that is necessary as a reset current, as compared to a diode formed of only silicon. On the other hand, an opposite-direction leak current when a voltage with a negative value is applied is almost the same as that of the diode formed of silicon only.

Note that in the above-described embodiment, a similar advantage may be obtained even if the only part of the p+ type layer D1 that contacts with the interface of the electrode EL2 is formed of $Si_{1-x}Ge_x$ (0<x<=1), without forming the whole of the p+ type layer D1 with $Si_{1-x}Ge_x$ (0<x<=1).

[Method of Manufacturing]

Next, a method of manufacturing the nonvolatile semiconductor memory device in accordance with the embodiment is described with reference to FIGS. 12A-12G. FIGS. 12A-12E illustrate the method with a cross-sectional view along I-I' direction, and FIGS. 12F and 12G illustrate the method with a cross-sectional view along a direction perpendicular to I-I' direction.

Figure 12A:
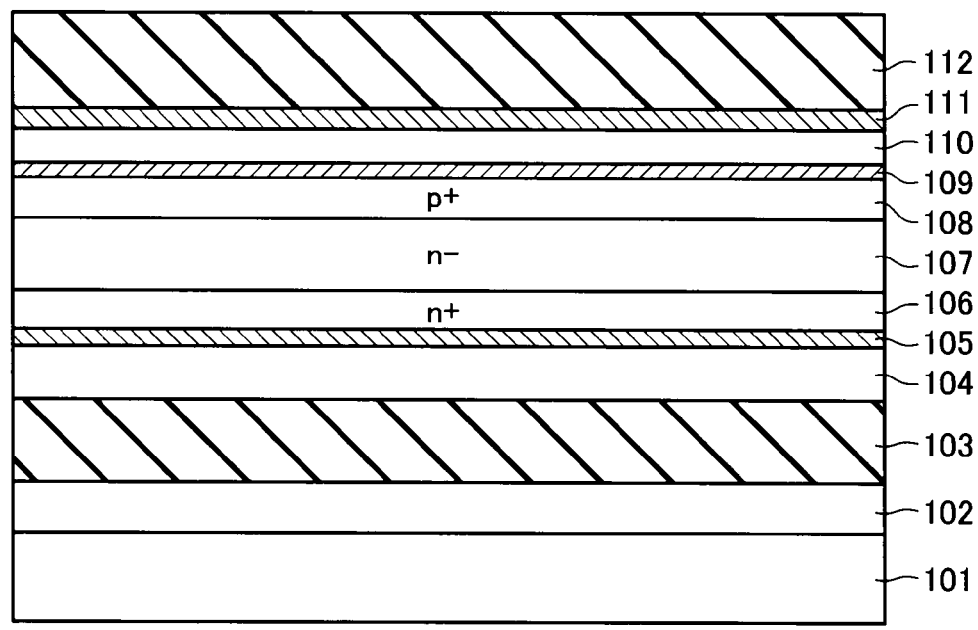
FIG. 12A explains one of the steps in a method of manufacturing the nonvolatile semiconductor memory device in accordance with the embodiment of the present invention.

First, as shown in FIG. 12A, on one surface of a silicon substrate 101 having a thickness of 720 μm there is formed a CMOS circuit layer 102 that includes various kinds of CMOS circuit, and so on. Formed sequentially on the CMOS circuit layer 102 are an insulating film 103, a composite film 104, a titanium nitride film 105, an n+ type semiconductor region 106, an n− type semiconductor region 107, a p+ type semiconductor region 108, a titanium nitride film 109, a resistance change material film 110, a titanium nitride film 111, and an insulating film 112.

The CMOS circuit layer 102 is formed using a normal CMOS process. The CMOS circuit layer 102 includes a MOSFET included in such as a peripheral circuit, not shown, and multi-layered wiring for supplying various kinds of voltages and signals to the peripheral circuit and so on; in addition, the CMOS circuit layer 102 includes wiring portions and so on for connection to the memory cell array.

The insulating film 103 is formed by performing CVD with TEOS as a main material to deposit a silicon oxide film ($SiO_2$) with a film thickness of about 300 nm on the CMOS circuit layer 102.

The composite film 104 is configured as a stacked structure of a layer of titanium nitride (TiN) with a film thickness of 10 nm, and a layer of tungsten (W) with a film thickness of 50 nm formed on the insulating film 103, and is formed by sputtering.

The titanium nitride film 105 is formed by, using a sputtering method, depositing a film of titanium nitride (TiN) with a film thickness of 10 nm on the composite film 104. The titanium nitride film 105 functions as a barrier metal for suppressing unnecessary diffusion of impurity into the n+ type layer D3 included in the diode DI.

The n+ type semiconductor region 106 is formed by depositing a film of amorphous silicon with a film thickness of 10 nm on the titanium nitride film 105, and then injecting the thus-created film with ions of arsenic (As) at an accelerating voltage of 1 keV. The n+ type semiconductor region 106 is an n+ type silicon layer formed by injecting arsenic (As) to an impurity concentration of about $10^{20}$ cm$^{-3}$. The n+ type semiconductor region 106 serves as the n+ type layer D3.

The n− type semiconductor region 107 is formed on the above-described n+ type semiconductor region 106. The n− type semiconductor region 107 is formed as follows. First, a film of amorphous silicon with a film thickness of 80 nm is deposited. Thereafter, a film composed of amorphous silicon-germanium mixture (a-$Si_{1-x}Ge_x$ (<x<=1)) with a film thickness of 10 nm is deposited by a low-pressure CVD method with monosilane (SiH4) and monogerman (GeH4) as a main material. Then, the resultant film is subject to an ion implantation of arsenic (As) at an accelerating voltage of 75 keV. Thereby the n-type semiconductor regions 107 with a film thickness of 90 nm and with arsenic (As) of $10^{17}$ cm$^{-3}$ in average is formed. This n− type semiconductor regions 107 functions as the n-type layer D2 of the diode DI.

On this n− type semiconductor region 107, the p+ type semiconductor region 108 is formed. The p+ type semiconductor region 108 is formed in the n− type semiconductor region 107 by performing an ion implantation of boron (B) with an accelerating voltage of 1 keV, thereby changing the upper part of the n− type semiconductor regions 107 into a p+-type semiconductor region. For example, p+ type semiconductor regions 108 may include boron (B) of $10^{20}$ cm$^{-3}$, and have a film thickness of 10 nm. The p+ type semiconductor region 108 functions as the p+ type layer D1 of the diode DI.

The film thicknesses of the n+ type semiconductor region 106, the n− type semiconductor region 107, and the p+ type semiconductor regions 108 in the final structure vary from the above-mentioned film thickness, due to heat processes that are performed later. Specifically, during a heat process for crystallization of amorphous silicon and amorphous silicon-germanium mixture $Si_{1-x}Ge_x$ (0<x<=1), as well as a heat process for activating impurity, impurity in these regions is diffused. Accordingly, in the final stage after all manufacturing processes are finished, the film thickness of the n+ type semiconductor region 106 and p+ type semiconductor region 108 increases by about 20 nm than the initial state. In contrast, the film thickness of the n-type semiconductor region 107 decreases by 40 nm. The above-mentioned film thickness is set, taking these phenomena into account in advance.

The titanium nitride film 109 with a film thickness of 10 nm, the resistance change material film 110 formed of $ZnMn_2O_4$ with a film thickness of 10 nm, and the titanium nitride film 111 with a film thickness of 10 nm are formed sequentially on the p+ type semiconductor region 108 by sputtering.

The titanium nitride film 109 and the titanium nitride film 111 each becomes the electrode layer of the resistance change element VR, and serves as a barrier metal. Next, the insulating film 112 is formed, by using CVD with TEOS as a main material, by depositing silicon oxide with a film thickness of 150 nm.

Figure 12B:
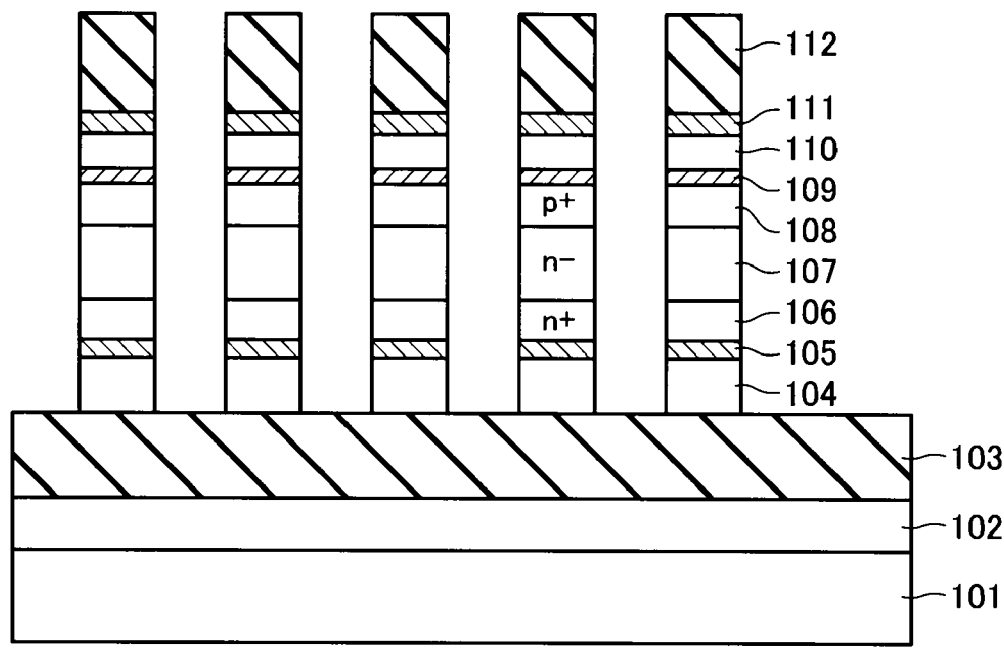
FIG. 12B explains one of the steps in a method of manufacturing the nonvolatile semiconductor memory device in accordance with the embodiment of the present invention.

Next, as shown in FIG. 12B, the composite film 104, the titanium nitride film 105, the n+ type semiconductor region 106, the n− type semiconductor region 107, the p+ type semiconductor region 108, the titanium nitride film 109, the resistance change film 110, the titanium nitride film 111 and the insulating film 112 are subject to patterning. First, an imprint lithography technology is used to form a resist pattern having a pitch of 44 nm, the thus-obtained resist pattern being used as a mask in a reactive ion etching utilizing $CHF_3$ and CO gas, thereby patterning the insulating film 112. Here, after stripping the resist, a pattern formed due to the insulating film 112 is used as an etching mask in a reactive ion etching utilizing Cl$_2$, Ar, and CO gas, thereby sequentially patterning the titanium nitride film 110, 109, the p+ type semiconductor region 108, the n− type semiconductor region 107, the n+ type semiconductor region 106, and the titanium nitride film 105. Then, the composite film 104 is patterned by a reactive ion etching using CHF$_3$ gas and SF$_6$ gas.

Figure 12C:
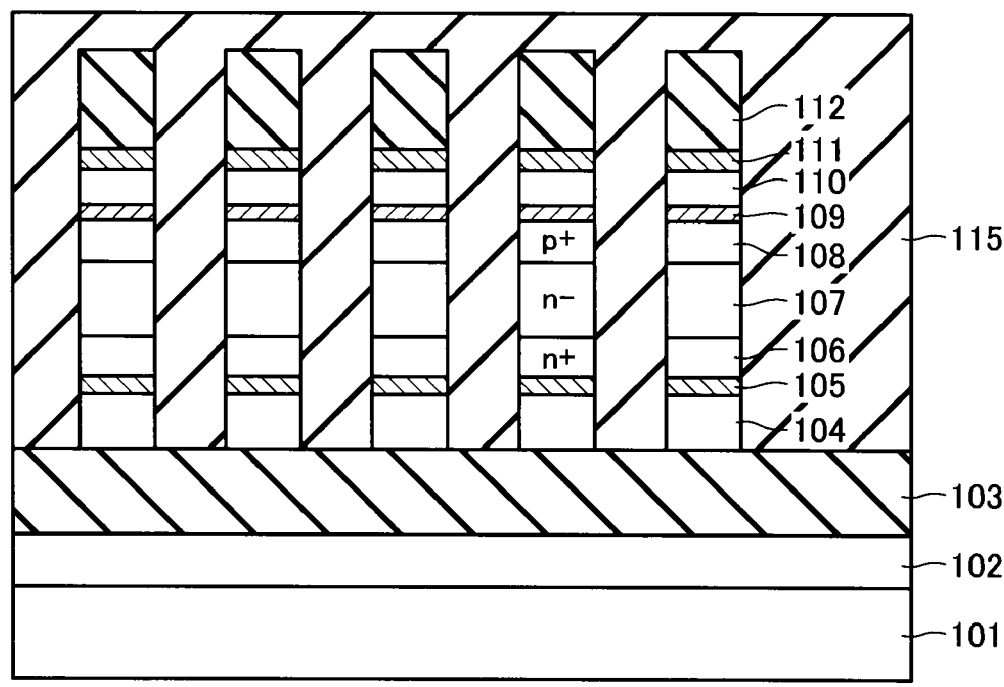
FIG. 12C explains one of the steps in a method of manufacturing the nonvolatile semiconductor memory device in accordance with the embodiment of the present invention.
Figure 12D:
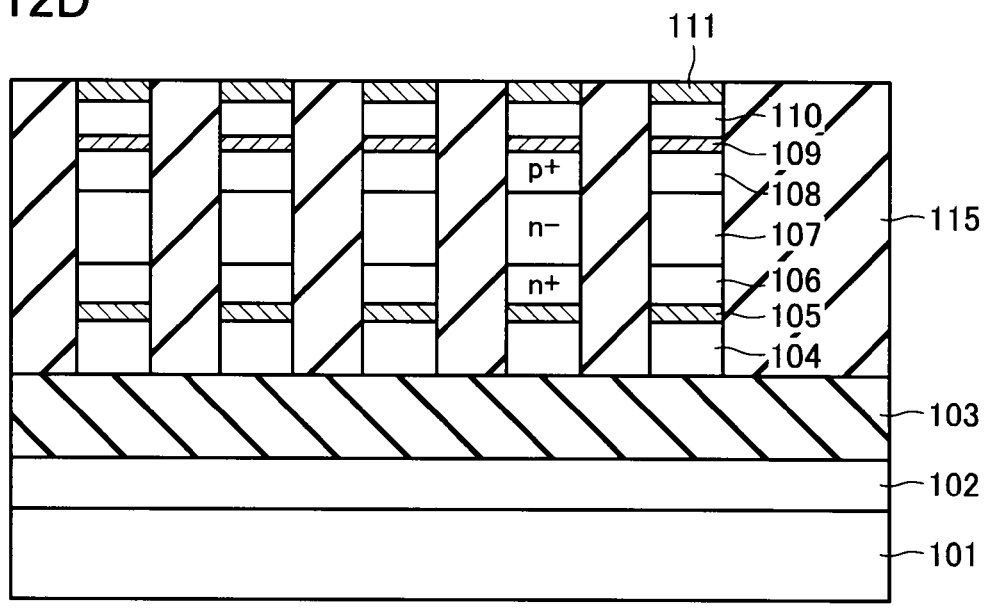
FIG. 12D explains one of the steps in a method of manufacturing the nonvolatile semiconductor memory device in accordance with the embodiment of the present invention.
Figure 12E:
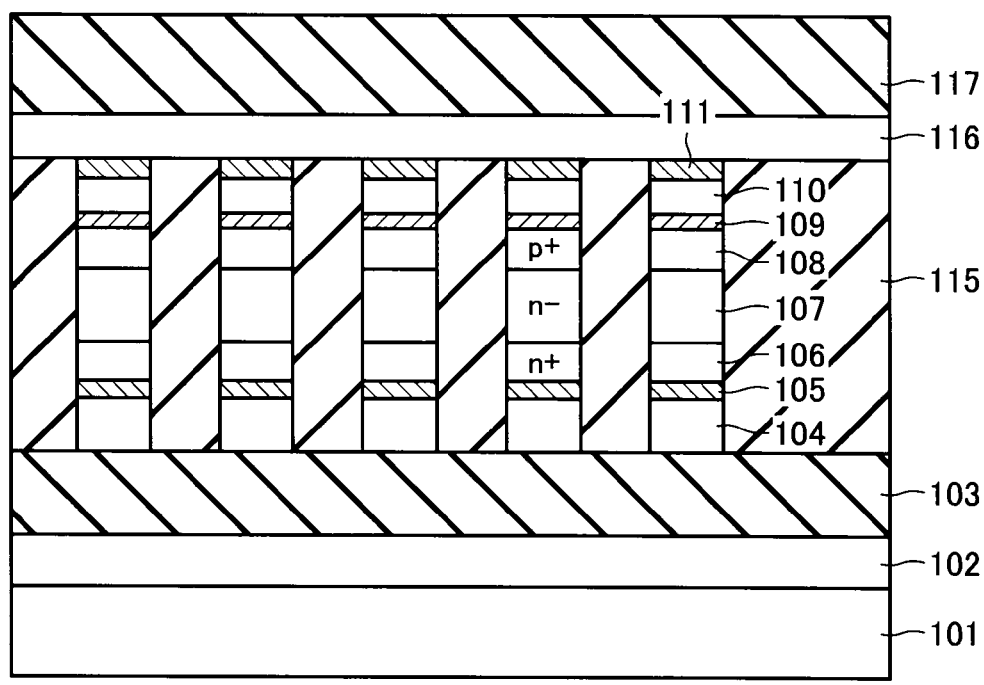
FIG. 12E explains one of the steps in a method of manufacturing the nonvolatile semiconductor memory device in accordance with the embodiment of the present invention.
Figure 12F:
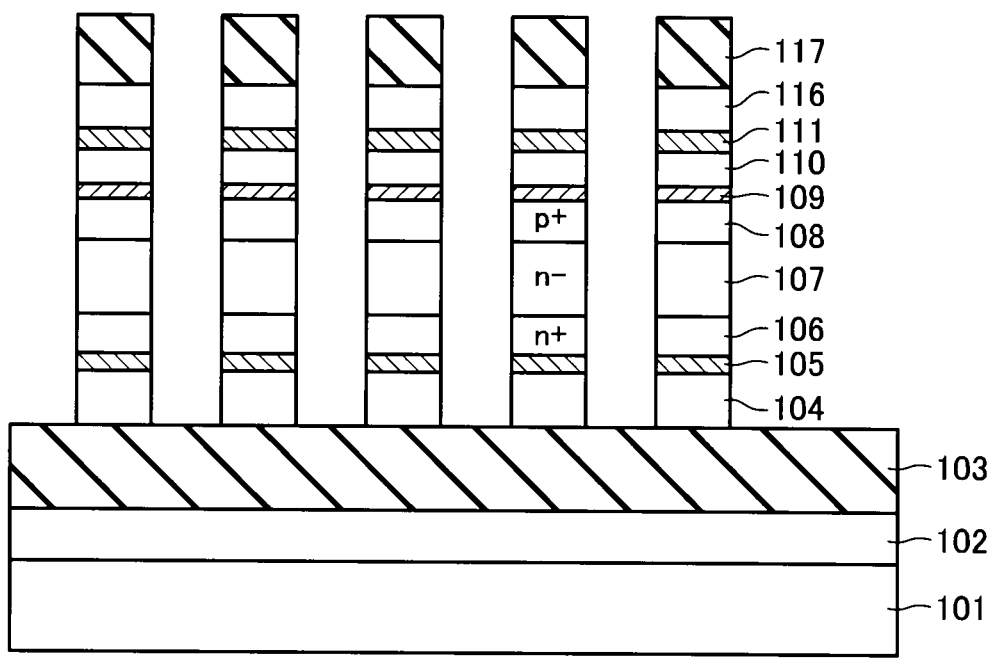
FIG. 12F explains one of the steps in a method of manufacturing the nonvolatile semiconductor memory device in accordance with the embodiment of the present invention.
Figure 12G:
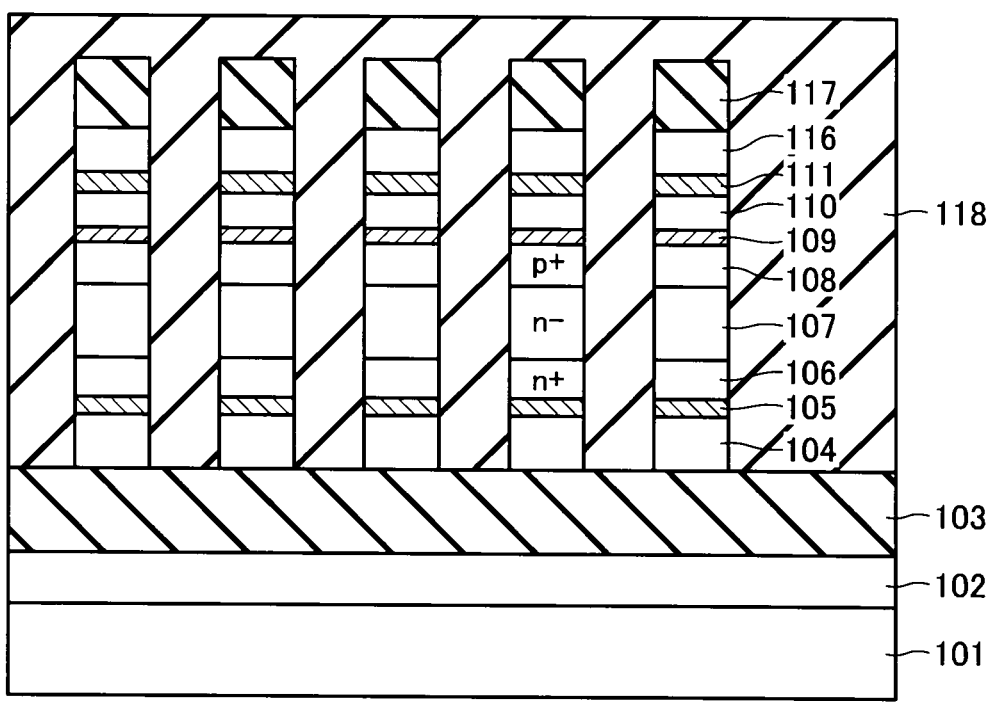
FIG. 12G explains one of the steps in a method of manufacturing the nonvolatile semiconductor memory device in accordance with the embodiment of the present invention.

Subsequently, as shown in FIG. 12C, a CVD method with TEOS as a main material is used to form an insulating film 115 constituted by silicon oxide (SiO$_2$). Next, as shown in FIG. 12D, a CMP method is used to planarize the insulating film 112 and the insulating film 115 with the titanium nitride film 111 as a stopper. Then, as shown in FIG. 12E, sputtering is used to form a composite film 116 constituted by stacking titanium nitride (TiN) with a film thickness of 10 nm and tungsten (W) with a film thickness of 50 nm. Then, CVD with TEOS as a main material is used to form an insulating film 117 constituted by silicon oxide (SiO$_2$).

Next, as shown in FIG. 12F, each layer is processed along a direction perpendicular to I-I' direction. That is to say, an imprint lithography technology is used to form a striped resist pattern having a pitch of 44 nm. Then, the thus-obtained resist pattern is used as a mask in a reactive ion etching utilizing CHF$_3$ and CO gas, thereby patterning the silicon oxide film 117.

Then, after stripping the resist, a pattern of a silicon oxide film formed in the insulating film 117 is used as an etching mask in a reactive ion etching utilizing CHF$_3$ and SF$_6$ gas, thereby patterning the composite film 116.

Subsequently, a reactive ion etching utilizing Cl$_2$, Ar, and CO gas is used to sequentially pattern the titanium nitride film 111, the resistance change material film 110, the titanium nitride film 109, the p+ type semiconductor region 108, the n− type semiconductor region 107, the n+ type semiconductor region 106, and the titanium nitride film 105, along the I-I' direction thereby forming the memory cells MC. Note that in this process, the n+ type semiconductor region 106 and the titanium nitride film 105 need not be completely divided from each other by etching.

Next, as shown in FIG. 12G, a silicon oxide film capable of spin coating is used to fill trenches between the memory cells MC, while forming an insulating film 118 constituted by silicon oxide on the entire surface of a wafer.

Subsequently, although not shown, connecting portions for CMOS circuits in the CMOS circuit layer 12, the composite films 104 and 116 are formed. Thereafter, as a final process, heat treatment at 800° C. and 5 seconds is performed, to conduct crystallization of the amorphous silicon and amorphous silicon-germanium mixture, as well as activation of impurity therein at the same time. Thereafter, a so-called passivation film is formed. Then, after a wiring connection portion as an input/output portion is formed, a so-called post-processes such as inspections and dicing are performed to complete a semiconductor memory device according to the embodiment of the present invention.

Note that when the memory cell array is formed in a multi-layer structure (FIG. 6), the aforementioned processes may be repeatedly conducted to obtain a desired multi-layered structure. In the aforementioned manufacturing process, phosphorous (P) may be used as an n type impurity instead of arsenic (As). Alternatively, by changing atoms to be injected in the ion-injecting step, it is possible to form a diode having a different lamination structure.

In the above-described example, a method of injecting impurity atoms into a silicon film formed by un-doped CVD deposition is used to form the diode DI; however, it is also possible to form the diode using doped CVD deposition. In this case, addition of AsH$_3$ gas for doping with arsenic (As), addition of PH3 gas for doping with phosphorus (P), and addition of BCl$_3$ gas for doping with boron (B) may be used, wherein adjusting a doping amount during deposition allows a desired impurity concentration distribution to be obtained.

This concludes description of embodiments in accordance with the present invention, but it should be noted that the present invention is not limited to the above-described embodiments, and that various alterations, additions, and so on, are possible within a range not departing from the scope and spirit of the invention.

What is claimed is:

1. A semiconductor memory device, comprising:
a plurality of first wirings and a plurality of second wirings formed to intersect with each other; and
a memory cell array including memory cells arranged therein, each of the memory cells being located at respective intersections between the first wirings and the second wirings, each of the memory cells having a rectifier element and a variable resistance element connected in series,
the rectifier element including:
a p type first semiconductor region;
a n type second semiconductor region; and
a third semiconductor region formed to be sandwiched between the first and second semiconductor regions, and having an impurity concentration that is smaller than those of the first and second semiconductor regions, the first to third semiconductor regions being laminated in the rectifier element,
the first semiconductor region being formed of, at least in part, silicon-germanium mixture (Si$_{1-x}$Ge$_x$ (0<x<=1)), and
the second and third semiconductor regions being formed of silicon (Si).

2. The semiconductor memory device according to claim 1, wherein
an energy level of the border between the first and third semiconductor regions is discontinuous.

3. The semiconductor memory device according to claim 1, wherein
the first semiconductor region include boron (B) as impurity.

4. The semiconductor memory device according to claim 1, further comprising a metal electrode contacting the first semiconductor region with Schottky contact,
wherein a work function qΦs of Si$_{1-x}$Ge$_x$ included in the first semiconductor region is larger than a work function qΦm of metal included in the metal electrode.

5. The semiconductor memory device according to claim 4, wherein
an energy level of the border between the first and third semiconductor regions is discontinuous.

6. The semiconductor memory device according to claim 4, wherein
the metal electrode is formed of material having a work function of 5.2 eV or less.

7. The semiconductor memory device according to claim 5, wherein
the metal electrode is formed of any one of TiN, W, WN, TaN, TaSiN, TaSi$_2$, TiC, TaC, and Nb—TiO$_2$.

8. The semiconductor memory device according to claim 6, wherein
an energy level of the border between the first and third semiconductor regions is discontinuous.

9. The semiconductor memory device according to claim 4, wherein the first semiconductor region include boron (B) as impurity.

10. The semiconductor memory device according to claim 1, wherein
the third semiconductor region is an n− type semiconductor region having an impurity concentration that is smaller than an impurity concentration of the second semiconductor region.

11. The semiconductor memory device according to claim 10, wherein
an energy level of the border between the first and third semiconductor regions is discontinuous.

12. The semiconductor memory device according to claim 10, wherein
the first semiconductor region include boron (B) as impurity.

13. The semiconductor memory device according to claim 1, wherein
the third semiconductor region is an p− type semiconductor region having an impurity concentration that is smaller than an impurity concentration of the first semiconductor region.

14. The semiconductor memory device according to claim 13, wherein
an energy level of the border between the first and third semiconductor regions is discontinuous.

15. The semiconductor memory device according to claim 13, wherein
the first semiconductor region include boron (B) as impurity.

* * * * *